United States Patent [19]
Costa

[11] Patent Number: 5,263,567
[45] Date of Patent: Nov. 23, 1993

[54] HORIZONTAL VIBRATOR METHOD FOR ORIENTING ARTICLES

[75] Inventor: Pat V. Costa, Nessequogue, N.Y.

[73] Assignee: Robotic Vision Systems, Inc., Hauppauge, N.Y.

[21] Appl. No.: 981,835

[22] Filed: Nov. 25, 1992

[51] Int. Cl.$^5$ .............................. B65G 47/24
[52] U.S. Cl. ................ 198/382; 29/759; 29/DIG. 46
[58] Field of Search ........ 198/382, 394, 771; 29/759, 760, DIG. 46; 193/2 B

[56] References Cited

U.S. PATENT DOCUMENTS

| | | | |
|---|---|---|---|
| 2,765,900 | 10/1956 | Seabrooke | 193/2 B |
| 3,881,605 | 5/1975 | Grussman | 198/394 X |
| 4,809,839 | 3/1989 | Elliot | 198/771 X |

FOREIGN PATENT DOCUMENTS

| | | | |
|---|---|---|---|
| 0267210 | 10/1989 | Japan | 198/382 |
| 0267211 | 10/1989 | Japan | 198/382 |
| 0083710 | 4/1991 | Japan | 198/382 |

Primary Examiner—D. Glenn Dayoan
Attorney, Agent, or Firm—Max Fogiel

[57] ABSTRACT

A method for producing relative motion on multiple articles by providing a tray with cavities, locating each article in a separate cavity and banking all articles against a similar cavity wall without tilting the tray, movement of the articles being generated by placing the tray between a horizontal vibration device and at least one cooperating bumper, the vibrations having an amplitude decreasing with time according to a predetermined decay envelope.

6 Claims, 3 Drawing Sheets

HORIZONTAL VIBRATOR METHOD FOR ORIENTING ARTICLES

BACKGROUND OF THE INVENTION

This present invention relates to increasing the utility of 3-D triangulation sensors which inherently take longer to gather data as their field of view is widened (at constant resolution).

The operation and application of 3-D triangulation sensors is well known in the art and is exemplified by U.S. Pat. Nos. 238,147, 4,590,367 and 5,028,799 which teach the relative motion between a sensor that projects a plane of light on an object whose surface data is to be recorded and the object itself. The plane of light may be formed by a collimated laser beam spread by a cylindrical lens or by a spot of light which is deflected by a mirror mounted on a galvanometer, mechanical motion, spinning mirror, or acousto-optic deflector to form an equivalent plane made of a group of spots. The surface depth information is obtained by reading a signal for each part of the plane from a position sensing detector which may be a TV camera, a linear photodiode array, or a linear or area type photoconductive device which provides a voltage ratio proportional to the x and/or y position of an incident light spot. All of these detectors and their use for range readout in 3-D triangulation systems are well known by those versed in the state of the art.

When a scanned spot is used to create the light plane and each spot is immediately read out from the detector, the scan time to scan a given area increases in proportion to the number of spots since a finite time is required to project the light energy and to read out the data for each spot. When an integrating device such as a TV camera is used to gather the data from a projected plane (or equivalent group of spots) the width that can be accommodated is defined by the resolution of a pixel (often 1/512th of the length or width of the detector) and the corresponding resolution desired on the object. This follows from the typical camera pickup resolution created by a 512 by 512 pixel array. The readout time for the 3-D data contained in the projected plane corresponds to the time to read the picture frame which is normally 1/30th of a second. Thus, again, the number of 3-D points scanned and read out is limited by time available; typically 512 3-D points in 1/30th of a second.

3-D sensors are often translated via mechanical means which carry the sensor along its intended measurement path, often at a constant velocity. Any time the path is changed from a straight line or changes to a new straight line path, it is required that the mechanism be accelerated and/or decelerated which often slows the net scanning speed far below what would be achieved if acceleration were not required. This is particularly a problem when scanning around the periphery of a particular semiconductor device in a tray since it requires three changes of direction to scan leads on the four sides of the device. It is an important object of this invention to significantly reduce the number of times this acceleration/deceleration is required.

SUMMARY OF THE INVENTION

It is the object of the present invention to describe a vibratory method of locating all the IC chips against a common banking side of their individual cavities.

According to the present invention, a vibrator pushes against the tray in a programmed oscillatory manner against compliant restraints. This progressively "walks" all chips in a common direction until they bank against their individual cavity wall.

The motion is parallel to the vibratory action.

The method reduces the positional uncertainty of the location of the chips in their tray. It establishes a common datum from which all chips my be referenced during the inspection cycle.

The process does not interfere with the transport/inspection cycle.

The process, also, is a short one requiring only a brief duration compared to the total inspection cycle.

Thus, the present invention augments the efficiency of the 3-D triangulation sensor that measures the geometry of the IC chip leads. The total process is automated as follows:

(a) Chips located multiply in plastic trays are stacked at the input.
(b) The trays are singularized and passed to the inspection station.
(c) All chips are scanned optically (inspection phase).
(d) The trays then pass to a PNP output station where they are sorted.
(e) Full trays are then restacked.

At the inspection station, prior to optical scanning, a geometric datum must be established. Each chip which can float within the cavity provided must be moved until it banks against the cavity wall.

It is additionally required that all the chips move in a similar way so that the same wall of each cavity is used as a datum.

After inspection it is not necessary that the banked condition be maintained. Mechanical motions which disturb the condition are of little significance and the chip may now float again within the confines of the cavity.

A feature of the chip banking process is that it requires no external handling and is compatible with the tray transport process. It also is simple and adds little time to the total transport/inspection schedule.

DESCRIPTION OF PREFERRED EMBODIMENTS

Figure 1:
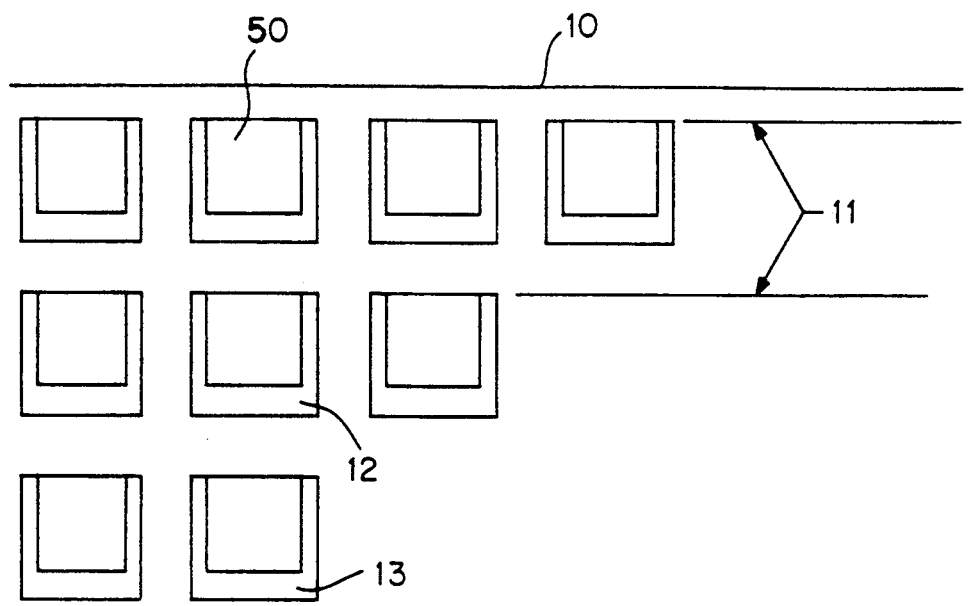
FIG. 1 is a schematic plan view of a portion of the tray and the IC chips located in their cavities, with the IC chips being shown banked against a common datum ready for inspection.

FIG. 1 is a schematic view of a portion of a typical tray 10 with the IC (integrated circuit) chips 50 within their cavities 13. They are shown banked against a common datum 11 for each row. This is the desired location of the IC chips 50 prior to inspection. Upon entering the inspection area, the chips 50 may be anywhere within their cavities 13. After vibrating they will be banked against the datum 11. This process occurs immediately after the transport cycle to the inspection station is complete, and just prior to inspection.

Figure 2:
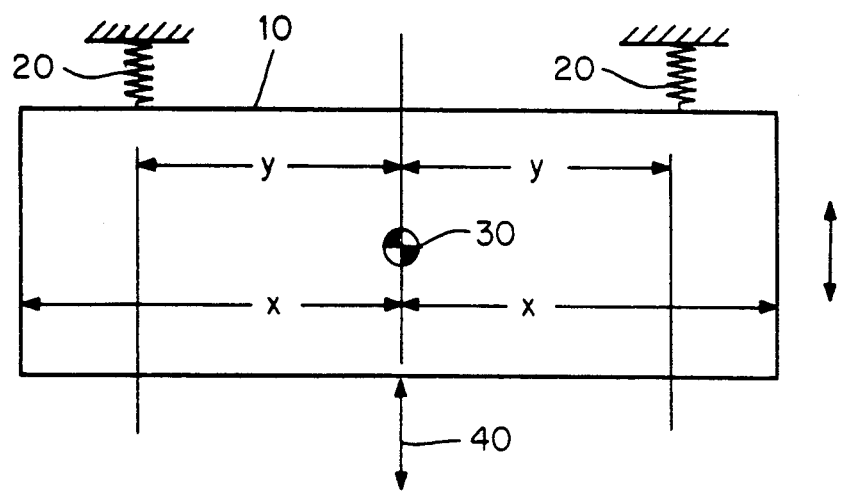
FIG. 2 is a schematic plan view of a tray embodying the configuration for the vibratory banking process, with the tray and chip subassembly being symmetrically configured with respect to the actuator, center of gravity and compliant restraints.

FIG. 2 shows the components needed for a preferred embodiment to practice the invention. Schematically the tray 10 which holds the IC chips is shown located between the compliant restraints 20 and the vibrator actuator 40. This figure demonstrates the requirements for geometric, mass, compliance and force symmetry.

If this symmetry condition is not reasonably obtained, a secondary mode of oscillation can occur: thus, the tray 10 will both translate parallel to the driver 40 and rock about its CG (center of gravity) 30. If this last mode becomes excessive, net motion at the ends of the tray may not be in phase, with the CG 30 vibrations and may cause reverse motion of the end chip. The present invention emphasizes approaches to symmetry so that all chips move in a common direction. When tray lengths change, the bumper and vibrator locations are altered to maintain approximate symmetry.

The spring rates of the bumpers 20 must be nearly equal. If more than 2 bumpers are used these must be symmetrically placed to prevent rocking modes.

Figure 3:
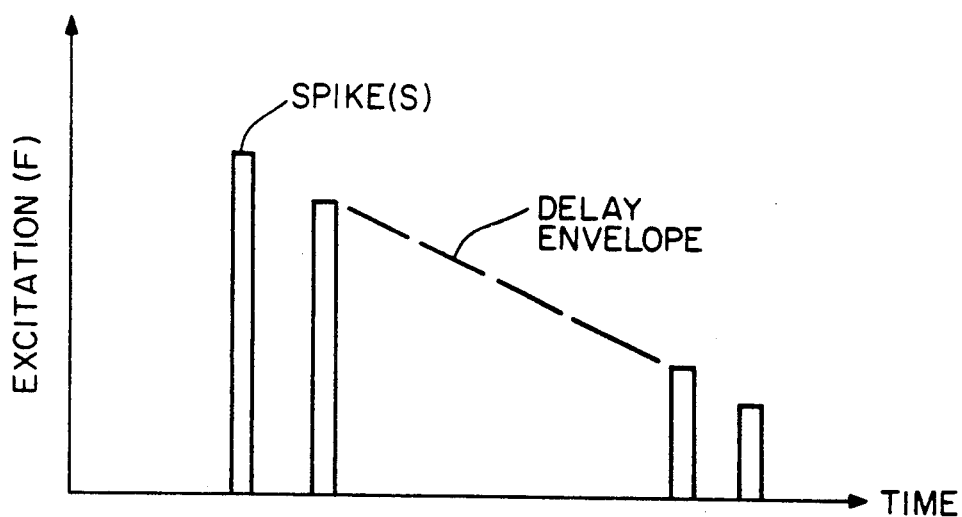
FIG. 3 is a force versus time profile of the actuator when engaging the tray, and illustrates the programmed decay of the spike peaks.

FIG. 3 shows the preferred schedule of force vs time that is required to correctly bank the IC chips. The vibratory driver 40 is driven in a series of pulsed spikes which diminish with time. The force is an analog of the input profile. The decay function as well as the entire profile is alterable to suit the chip 50 size, shape and tray 10 configuration. The decay is scheduled so the chip rebound from the cavity wall 11 is minimized. Initially the spikes are high, creating a larger motion of the chips 50. At the end of the sequence when the chip 50 has migrated close to the wall 11 of the cavity 13, rebound is possible. However, at this time the spike intensity is reduced so that the rebound effect is negligible. The process gently fades away. It is of extremely short duration and adds only a very small time increment to the total cycle.

Figure 4:
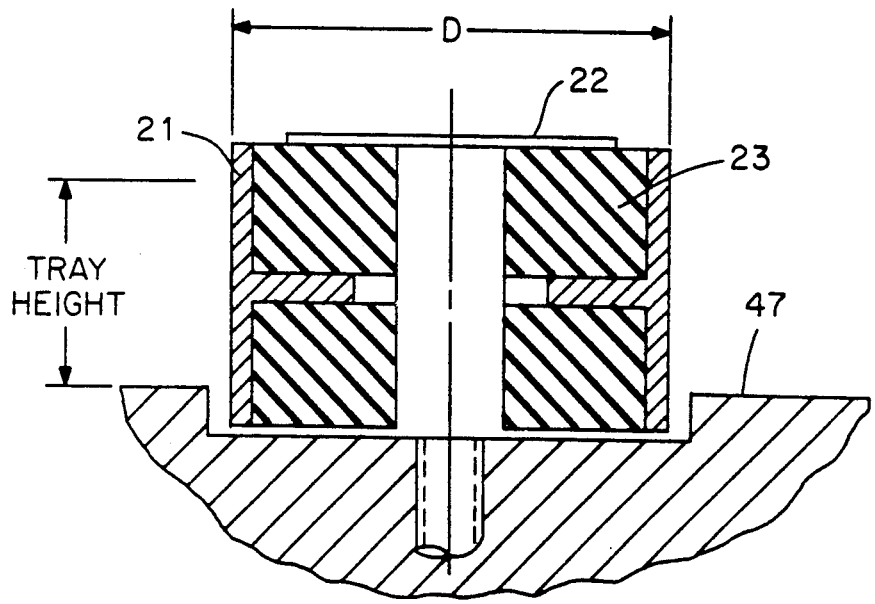
FIG. 4 is a schematic sectional view of a compliant restraint, and shows a cylindrical assembly whose outer shell is movable by deflecting the compliant inner fillers.

FIG. 4 shows the preferred configuration of the compliant restraints 20. A central cylindrical post 22 holds the unit to the surface of the inspection station 47. Rubber washers 23 surround the post 22. These are compliant and in turn are enclosed by an outer sleeve 21. During vibration the restraint deflects by deforming the rubber washers 23, thereby allowing the sleeve 21 to deflect. The entire assembly can also rotate and tilt to accommodate tray 10 transport motions. The sleeve 21 bottom is below the tray 10 bottom and does not touch its cavity, thereby allowing total free motion without rubbing as the tray 10 is vibrated. Other elastomers, o-rings, metal springs, etc. can be used in place of the rubber washers 23 to make the unit more temperature insensitive or adjust compliance as required. Most elastomers in the configuration exhibit a non-linear force-deflection property which makes the compliant restraint non-linear. This is typical of elastomers and the shape factor of the bumper 20 results in a spring which becomes stiffer with deflection. This effect causes the vibratory motion to rebound quickly at the end of the stroke and aids the chip 10 banking process.

Figure 5:
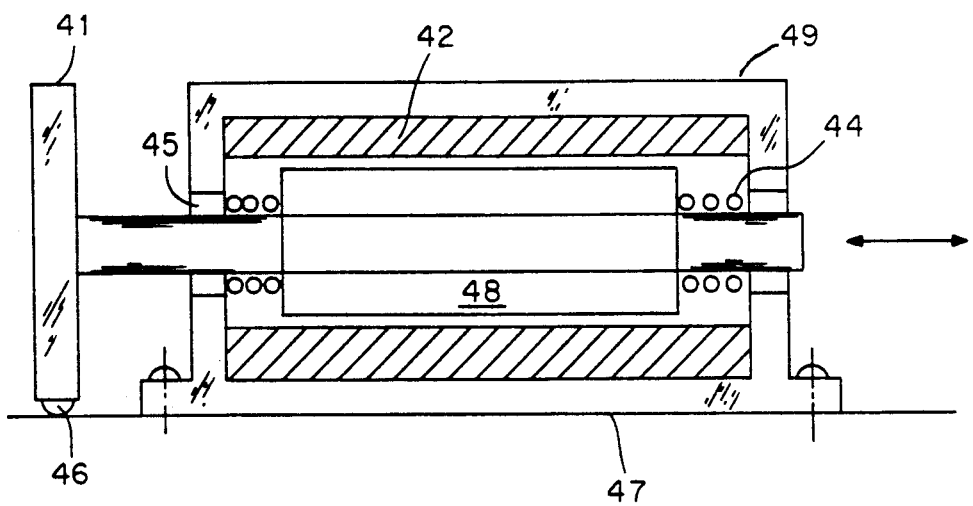
FIG. 5 is a cross sectional view of a solenoid vibration actuator design, and shows an armature driven by the electrical coil and returned to center by light spring members.

FIG. 5 is a section of the preferred configuration of the vibrator actuator 40. An armature 48 is guided by linear sleeve bearings, 45, in the housing 49. The armature drives a pusher 41. The base of the pusher 41 rests on the station surface 47. It contains slippery auxiliary slider bearings 46. Two return springs 44 center the armature at rest. A coil 42 accepts the electrical excitation according to FIG. 3 and drives the armature 48 in an analog fashion according to its mass. The configuration can be altered to include non-linear springs, damping, etc., as required. In the preferred configuration the return springs 44 are much softer than the compliant restraints 20 so that the system dynamics are largely dependent on the tray 10 mass and the bumper restraint 20.

Figure 6:
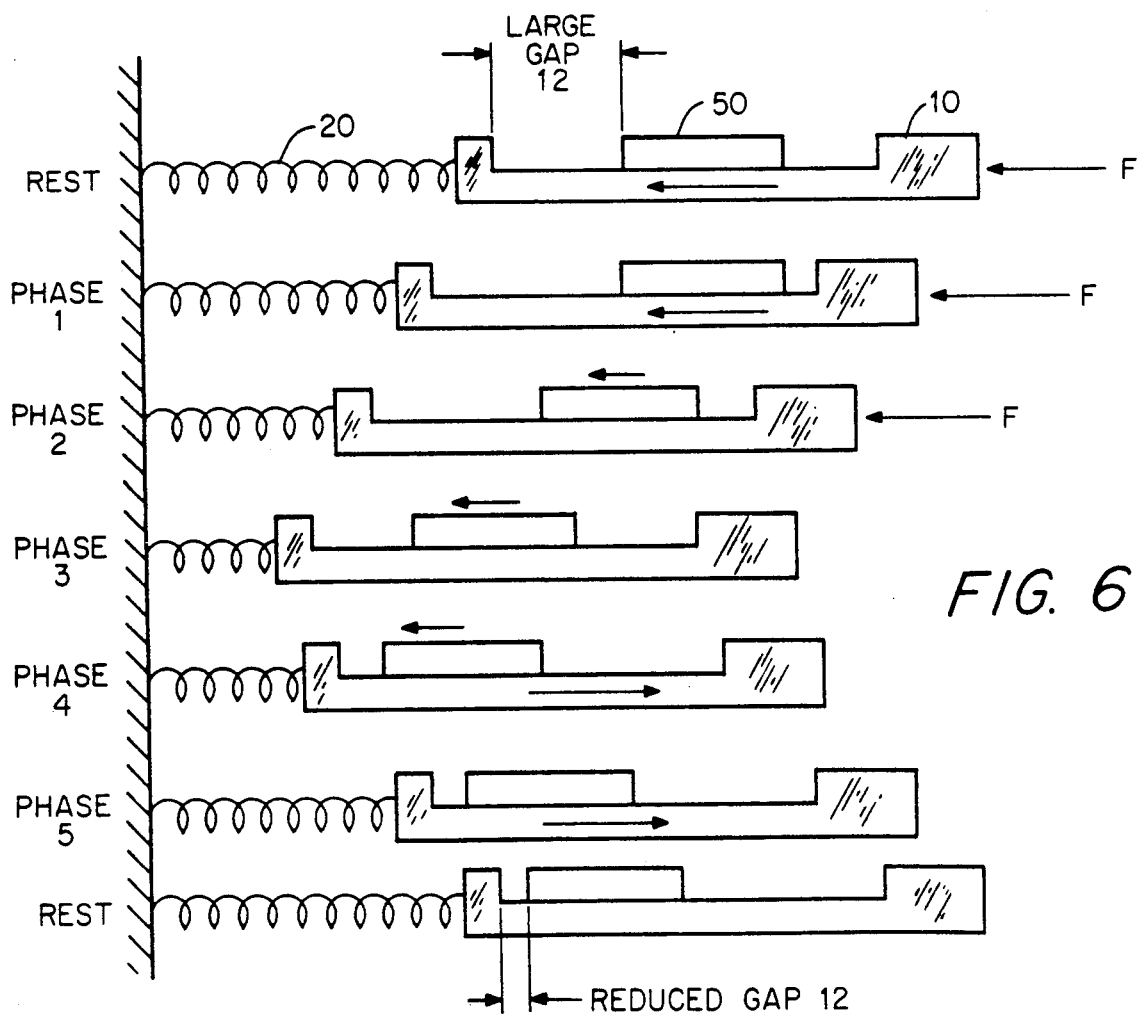
FIG. 6 is a schematic representation of the progression of motion of the IC chip in its cavity, and the tray motion under the influence of the vibrator force as a function of time, during one force spike.

FIG. 6 is a progressive description of the motion of the IC chip 50 in the tray 10 cavity 13, during the period of the spike (from rest to rest). Initially, prior to the spike input, the system is at rest and the gap 12 is large. When the spike is applied the force drives the tray 10 against the compliant member (bumper) 20. The system responds in a series of phases and when it finally comes to rest, the gap 12 is reduced. As the spikes are repeated, the gap 12 finally shrinks to zero. The entire process is very short and consumes less than 1 second. The profile can be reprogrammed in accordance with the tray 10 mass and size configuration.

A major factor in this process is the coefficient of friction between the chips 50 and the tray cavity 12. Typical of all materials, the tribology is a function of relative velocity at the friction interface. Thus, (a) Stiction: - This occurs before impending sliding occurs. Typically the impending coefficient of friction is high.

(b) Sliding Friction: - After relative motion occurs, the coefficient of friction drops. For the process described, it is usual to find that the coefficient drops as sliding velocity increases.

The dynamics of the process as the vibration affects the tray 10 and the IC chips 50 is as follows:

The tray 10 is compliance-restrained by the bumpers 20 which act as non-linear springs.

The IC chips 50 are friction-coupled to the tray 10. The following paragraphs break the total action into phases.

Phase 1

The Vibrator 40 pushes against the tray 10 causing it to accelerate. At the initial stage, the bumper spring 20 is relatively uncompressed and acceleration is maximum. The tray 10 moves forward. The chip 50 being coupled to the tray 10 by friction will stand still in inertial space if the tray 10 acceleration exceeds $\mu_s g$ where:

$\mu_s$ = static coefficient of function g = acceleration of gravity i.e., when $a \geq \mu_s g$ the instantaneous slippage occurs and the chip 50 lags the tray 10 in an internally referenced frame.

Phase 2

At this point the tray 10 is slipping forward with respect to the chip 50 which is stationary. It exerts a friction drag on the chip 50. Since the relative velocity between chip 50 and tray 10 is relatively low (due to the fact that the tray 10 is just beginning to accelerate), the coefficient of friction is close to $\mu_o$: i.e., a stiction condition exists.

The tray 10 then drags the chip 50 causing it to accelerate in the same sense as the tray 10. Here the chip 50 motion is described as:

$$F_{net} = \mu_o m_c g = m_c \hat{X}_c$$

where $\mu_o$ = static coefficient of friction
$m_c$ = mass of chip 50
$g$ = acceleration of gravity
$\hat{X}_c$ = acceleration of chip 50 in inertial space

Phase 3

As both tray 10 and chip 50 move in the same sense the effect of the bumper 20 becomes important. It creates a spring force that resists the vibrator 40 force. Simultaneously the solenoid 42 is de-energized and returns to its rest position no longer affecting the tray 10. The tray 10 is now totally influenced by the return force of the bumper 20. This force is non-linearly proportional to the deflection of the bumper 20 and, at the advanced position at this stage of the process, is quite high.

$$F_B = -\phi(k_s, x_t)$$

where $F_B$ is force exerted by the bumper, 20
$k_s$ is bumper, 20 spring rate
$x_t$ is the bumper, 20
$\phi$ is the deflection force relation The negative sign indicates that the force opposes the motion. The tray 10 is now decelerated and it turns around returning to its original position.

The chip 50 however is only affected by the slowing effect friction drag and attempts to continue moving in the forward direction.

Phase 4

The tray 10 is now moving in a reverse direction to the chip 50 which is coasting forward. The relative velocity between the two is high. Thus the coefficient of friction is a dynamic one and is lower than the static coefficient. The reverse moving (rebounding) tray 10 exerts a lower drag force on the chip 50 and is not as effective in decelerating it as previously.

The chip 50 motion in inertial space is:

$$F = m_c g \mu_d = -m_c \hat{X}_c$$

where symbols are as previously and $\mu_d$ is the dynamic coefficient of friction.

Thus the chip 50 is decelerated slowly and continues to coast in the forward direction.

Phase 5

The chip 50 ultimately coasts to a full stop being decelerated by the friction drag of the tray 10. Simultaneously the tray 10 has returned to its rest position (and may continue to coast backwards). However, the friction exerted by the clamp station 47 on the tray 10 minimizes this last motion. At this time both tray 10 and chip 50 have ceased motion. However, the chip 50 has advanced forward on the tray 10 when compared with its original position at the start of the cycle, i.e., it has moved towards the cavity wall 11.

Further Action

The steps of Phases 1 through 5 are repeated according to the force profile of FIG. 3. Each successive spike advances the chip 50 forward until it banks on the cavity wall 11.

What is claimed is:

1. A method for producing relative motion of multiple articles, comprising the steps of: providing a tray with cavities; locating each article in a separate cavity and banking all articles against a similar cavity wall without tilting said tray; generating a direction of motion for travel of said articles towards said wall by placing said tray between a horizontal vibration means and at least one cooperating bumper means so that said articles are induced to travel in said direction when said horizontal vibration means is activated; generating vibrations in said horizontal vibration means and having an amplitude decreasing with time according to a predetermined decay envelope; said articles being induced to travel in said direction by the following steps taken in sequence: accelerating said tray by pushing against said tray with said vibration means so that said tray slips toward with respect to said articles while said articles remain stationary; accelerating said articles in said direction by dragging said articles through a first friction exerted on said articles; resisting action of said vibration means with said bumper means as said tray and articles move in said direction and decelerating said tray; reversing motion of said tray while being decelerated and returning said tray to an initial position while said articles continue to move in said direction at a decelerated rate through a second friction exerted on said articles; bringing said articles to a full stop after being decelerated by said second friction and returning simultaneously said tray to said initial position so that all said articles have moved against said wall when said tray and articles have ceased moving.

2. A method as defined in claim 1, wherein said step of accelerating said tray has an initial stage with said bumper means having a substantially uncompressed spring and said acceleration is maximum, said articles lagging said tray while said tray slips forward with respect to said articles and relative velocity between tray and articles being substantially low.

3. A method as defined in claim 1, wherein said first friction exerts a drag friction on said articles in a stiction condition.

4. A method as defined in claim 1, wherein said tray is fully influenced by a return force of said bumper means in said step of resisting action of said vibration means with said bumper means, said return force being non-linearly proportional to deflection of said bumper means.

5. A method as defined in claim 1, wherein relative motion between said tray and said articles is substantially high in said step of reversing motion of said tray, said second friction having a dynamic coefficient of friction.

6. A method for producing relative motion of multiple articles, comprising the steps of: providing a tray with cavities; locating each article in a separate cavity and banking all articles against a similar cavity wall without tilting said tray; generating a direction of motion for travel of said articles towards said wall by placing said tray between a horizontal vibration means and at least one cooperating bumper means so that said articles are induced to travel in said direction when said horizontal vibration means is activated; generating vibrations in said horizontal vibration means and having an amplitude decreasing with time according to a predetermined decay envelope; said articles being induced to travel in said direction by the following steps taken in sequence: accelerating said tray by pushing against said tray with said vibration means so that said tray slips forward with respect to said articles while said articles remain stationary; accelerating said articles in said direction by dragging said articles through a first friction exerted on said articles; resisting action of said vibration means with said bumper means as said tray and articles move in said direction and decelerating said tray; reversing motion of said tray while being decelerated and returning said tray to an initial position while said articles continue to move in said direction at a decelerated rate through a second friction exerted on said articles; bringing said articles to a full stop after being decelerated by said second friction and returning simultaneously said tray to said initial position so that all said articles have moved against said wall when said tray and articles have ceased moving; said step of accelerating said tray having an initial stage with said bumper means having a substantially uncompressed spring and said acceleration is maximum, said articles lagging said tray while said tray slips forward with respect to said articles and relative velocity between tray and articles being substantially low; said first friction exerting a drag friction on said articles on a stiction condition; said tray being fully influenced by a return force of said bumper means in said step of resisting action of said vibration means with said bumper means, said return force being non-linearly proportional to deflection of said bumper means; relative motion between said tray and said articles being substantially high in said step of reversing motion of said tray, said second friction having a dynamic coefficient of friction.

* * * * *